United States Patent [19] [11] 4,410,598
Kuzel et al. [45] Oct. 18, 1983

[54] PROCESS FOR PREPARATION OF INSULATING COATINGS UPON STEEL

[75] Inventors: Radomir Kuzel, Prague; Josef Broukal, Hradec Kralove; Vaclav Bouse, Pribram, all of Czechoslovakia

[73] Assignee: Universita Karlova, Prague, Czechoslovakia

[21] Appl. No.: 341,134

[22] Filed: Jan. 20, 1982

[30] Foreign Application Priority Data

Jan. 21, 1981 [CS] Czechoslovakia ............... 442-81

[51] Int. Cl.$^3$ .................................................. B32B 9/00
[52] U.S. Cl. ............................... 428/427; 427/193; 427/202; 427/203; 427/204; 427/330; 427/376.5; 427/419.3; 427/419.4; 428/428; 428/433; 428/471; 428/472
[58] Field of Search ............... 427/202, 204, 205, 197, 427/287, 282, 376.5, 419.4, 419.3, 419.7, 330, 203, 193; 428/428, 427, 433, 471, 472

[56] References Cited

U.S. PATENT DOCUMENTS 3,906,124  9/1975  Carini .......................... 427/419.4
4,110,487  8/1978  Rion ............................ 427/419.4
4,256,796  3/1981  Hang et al. ...................... 427/330

Primary Examiner—Shrive P. Beck
Assistant Examiner—Janyce A. Bell

[57] ABSTRACT

Steel products may be coated with an insulating composition by a process which involves coating a uniform layer of finely ground glass powder on the steel and burning it at temperatures ranging from 700°–1000° C. Following, a paste comprising a mixture of the aforementioned glass, aluminum oxide and an evaporable liquid are deposited upon the burned coating, dried and burned again at 700°–1000° C.

The resultant coatings adhere well to steel and resist temperatures as high as 860° C., so suggesting then use for coating steel destined as a substitute for ceramic supports in electronic and hybrid microelectronic applications.

8 Claims, No Drawings

PROCESS FOR PREPARATION OF INSULATING COATINGS UPON STEEL

This invention relates to a process for the preparation of insulating coatings. More particularly, the present invention relates to a process for the preparation of insulating coatings for steel products.

Heretofore, steel products have been protected from the action of external effects and from the formation of iron scales at elevated temperatures by coating the surfaces thereof with various varnishes, enamels and the like. The enamel coatings have been found to be most heat resistive, so suggesting their use for preparing supports employed in hybrid microelectronics for printing resistors capable of being heated to temperatures of the order of 675° C. Unfortunately, most of the resistive pastes commonly employed in the preparation of resistive layers require burning to temperatures of the order of 850° C., a temperature level for which enamelled supports are not suitable.

In accordance with the present invention, this prior art limitation is effectively obviated by means of a novel process for preparing insulating coatings for steel sheets and steel products. Briefly, this process involves coating a uniform layer upon a steel product, the coating comprising ground barium-borate glass containing from 10–80%, by weight, barium (II) oxide, 10–70%, by weight, boron oxide, 0.1 to 10%, by weight, silicon dioxide and 0.1 to 40%, by weight, aluminum fluoride. The coating is next dried at a temperature less than 300° C. and burnt at a temperature ranging from 700° to 1000° C. Following the burning step, a uniform layer of a second coating is applied, the second coating comprising from 4 to 99.9%, by weight, of the aforesaid barium-borate glass, 0.1 to 96%, by weight, aluminum oxide and a liquid capable of being evaporated. Then, the coated structure is again subjected to burning at a temperature ranging from 700°–1000° C. Alternatively, the second coating may comprise a glassy-crystalline material such as a dielectric paste. Additionally, trace amounts ranging up to 60%, by weight, of powdered zinc oxide and/or powdered aluminum oxide may be added to the ground barium-borate glass of the first coating.

The prime advantage of the subject technique resides in the fact that it permits the formation of insulating ceramic coatings on steel products which are capable of being exposed to temperatures ranging up to 1000° C. without adverse effects. Thus, these coatings are suitable for use in steel sheets destined for use as supports for hybrid circuits.

The invention will be more readily understood by reference to the following exemplary embodiments which are set forth solely for purposes of exposition and which are not to be construed as limiting.

EXAMPLE 1

A sintered glass comprising 40%, by weight, barium (II) oxide, 5%, by weight, boron oxide, 5%, by weight, silicon dioxide and 5%, by weight, aluminum fluoride, was ground and milled to particles have a size less than 10 μm. Next, a steel sheet was coated with a thin layer of an oil, for example, silicone or engine oil. This end was effected by dipping the sheet into solution of gasoline and oil having a ratio of 20:1 (gasoline to oil). After removal from the solution, the gasoline was permitted to evaporate. The oil remaining on the steel sheet was of a sufficient thickness to permit coating with the glassy powder which was spilled directly onto the steel sheet which conveniently was placed perpendicularly or obliquely. Large agglomerates of the glassy powder which form on the surface of the sheet were eliminated by mechanically tapping the sheet. The coating was then dried at a temperature of 200° C. for a time period within the range of 5 to 10 minutes. Then, the dried coating was burned at a temperature of 860° C. for 8 minutes. Following, a second coating was deposited upon the steel sheet by screen printing thereon a paste comprising 12%, by weight, of the above-noted barium-borate glass, 47%, by weight, aluminum oxide and 41%, by weight, of an evaporable liquid containing 10%, by weight, ethyl cellulose and 90%, by weight, terpineol. The coated layer was then dried at 200° C. for a time period ranging from 5 to 10 minutes and burned at 860° C. for 15 minutes. The resultant coating was gray-white in color and adhered to the steel sheet at 850° C.

EXAMPLE 2

The base coating was prepared as in example 1, and a paste put thereon by screen printing. The paste had a composition of 37%, by weight, glassy powder, of the same composition as in example 1, 25%, by weight, aluminum oxide and 38%, by weight, of an evaporable liquid comprising 10%, by weight, ethyl cellulose and 9%, by weight, terpineol. The layer formed was burned at 840° C. for 8 minutes after being dried at 200° C. for a time period ranging from 5–10 minutes. The resultant coating was lustrous and evidenced a vitreous character. The coating adhered well to steel sheets and was capable of being varied by a thickness by the choice of sieve employed.

EXAMPLE 3

The base coating of example 1 was prepared again and deposited upon a steel sheet. Then, a dielectric paste was screen printed on the coating and dried at 150° C. for 15 minutes. Next, the coating was burned at 860° C. for 8 minutes. The resultant coating was gray-white in color and adhered well to the steel sheet.

EXAMPLE 4

A sintered glass of the composition described in Example 1 was mixed well with powdered zinc oxide having a particle size of 10 μm. The weight ratio of both components was 75%, by weight, ground glass, 25%, by weight, zinc oxide. The resultant mixture was put on the surface of a steel sheet by the procedure described in example 1, dried and burned at 860° C. for 8 minutes. A paste having the same composition as that described in example 1 was then put on the coating by screen printing, dried at 200° C. for 10 minutes and burned at 860° C. for 15 minutes. The resultant coating evidenced the same properties as the coating formed in example 1.

EXAMPLE 5

A sintered glass of the composition described in example 1 was mixed with powdered aluminum oxide having a particle size less than 10 μm, the weight ratio being 85%, by weight, ground glass and 15%, by weight, aluminum oxide. The mixture was deposited upon the surface of a steel sheet, dried at 200° C. and burned for 8 minutes at 860° C. A second layer was then prepared as in example 3.

We claim:

1. A process for the production of an insulating coating upon a steel product which comprises the steps of:
   (a) coating the steel product with a uniform first layer comprising a ground barium-borate glass consisting of,
      (1) from 10-80 weight percent of barium oxide,
      (2) from 10-70 weight percent of boron trioxide,
      (3) from 0.1 to 10 weight percent of silicon dioxide, and
      (4) from 0.1 to 40 weight percent of aluminum fluoride;
   (b) firing said first layer at a temperature within the range of 700-1000 degree C.,
   (c) depositing a second uniform layer comprising a paste upon said first layer, said paste consisting of:
      (1) from 4-99.9 parts by weight of the said barium-borate glass,
      (2) from 0.1 to 96 parts by weight of aluminum oxide, and
      (3) an evaporable liquid, the parts by weight of said second layer being based upon a composition comprising 100 parts by weight, and
   (d) firing said second layer of a tempertaure ranging from 700-1000 degree C.

2. A process in accordance with claim 1, wherein the second layer contains a dielectric paste.

3. A process in accordance with claim 1, wherein the first layer comprises barium-glass and from trace amounts to about 60 parts by weight, based on the total weight of the composition, of a powdered oxide selected from the group consisting of aluminum oxide, zinc or mixtures thereof.

4. A process in accordance with claim 1, wherein the evaporable liquid comprises a mixture of ethyl cellulose and terpineol.

5. A process in accordance with claim 3, wherein the oxide is zinc oxide.

6. A process in accordance with claim 3, wherein the oxide is aluminum oxide.

7. A process in accordance with claim 4, wherein said liquid comprises 10 parts by weight of ethyl cellulose and 90 parts by weight of terpineol.

8. Steel product including an insulating coating prepared in accordance with the process of claim 1.